(12) United States Patent
Sakai

(10) Patent No.: US 7,514,707 B2
(45) Date of Patent: Apr. 7, 2009

(54) GROUP III NITRIDE SEMICONDUCTOR LIGHT-EMITTING DEVICE

(75) Inventor: Hiromitsu Sakai, Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 11/667,449

(22) PCT Filed: Nov. 14, 2005

(86) PCT No.: PCT/JP2005/021190

§ 371 (c)(1),
(2), (4) Date: May 10, 2007

(87) PCT Pub. No.: WO2006/054673

PCT Pub. Date: May 26, 2006

(65) Prior Publication Data

US 2008/0035908 A1    Feb. 14, 2008

Related U.S. Application Data

(60) Provisional application No. 60/630,206, filed on Nov. 24, 2004.

(30) Foreign Application Priority Data

Nov. 16, 2004 (JP) ............................. 2004-331786

(51) Int. Cl.
*H01L 29/06* (2006.01)
(52) U.S. Cl. .................................. 257/13; 257/E33.028
(58) Field of Classification Search .................. 257/13, 257/E33.028
See application file for complete search history.

(56) References Cited

U.S. PATENT DOCUMENTS 6,495,894 B2 * 12/2002 Shibata et al. .............. 257/428

(Continued)

FOREIGN PATENT DOCUMENTS

JP     11-204882 A    7/1999

(Continued)

*Primary Examiner*—Wai-Sing Louie
*Assistant Examiner*—Bilkis Jahan
(74) *Attorney, Agent, or Firm*—Sughrue Mion, PLLC

(57) ABSTRACT

An object of the present invention is to provide a Group III nitride semiconductor light-emitting device with high emission efficiency.

The inventive Group III nitride semiconductor light-emitting device has an n-type layer, a light-emitting layer and a p-type layer composed of a Group III nitride semiconductor on a substrate, with the light-emitting layer sandwiched between the n-type layer and p-type layer, wherein the range for Δa as the ratio of the difference between the a-axis lattice constant of the layer between the light-emitting layer and substrate (or in the case of multiple layers with different compositions between the light-emitting layer and substrate, where each layer is grouped according to composition, the a-axis lattice constant of the group having the maximum thickness considering all of the layers belonging to the group) $a_1$ and the a-axis lattice constant of the light-emitting layer (or if the light-emitting layer has a multiple quantum well structure, the a-axis lattice constant determined from the zero-order peak representing the average composition of the well layers and barrier layers) $a_2$, represented by the following formula (I), is $-0.05 \leq \Delta a \leq 0.05$ (unit: %).

$$\Delta a = 100(a_1 - a_2)/a_1 \qquad (I)$$

9 Claims, 5 Drawing Sheets

U.S. PATENT DOCUMENTS

| | | | |
|---|---|---|---|
| 2001/0030319 A1* | 10/2001 | Sato et al. ........................ 257/14 |
| 2003/0015794 A1 | 1/2003 | Chang et al. |
| 2003/0132442 A1 | 7/2003 | Chang et al. |
| 2004/0164308 A1* | 8/2004 | Asatsuma et al. ............. 257/94 |

FOREIGN PATENT DOCUMENTS

| | | |
|---|---|---|
| JP | 2002-124702 A | 4/2002 |
| JP | 2002-261033 A | 9/2002 |
| JP | 2003-229645 | 8/2003 |
| TW | 502438 | 9/2002 |

* cited by examiner

GROUP III NITRIDE SEMICONDUCTOR LIGHT-EMITTING DEVICE

CROSS REFERENCE TO RELATED APPLICATION

This application is an application filed under 35 U.S.C. §111(a) claiming benefit, pursuant to 35 U.S.C. §119(e)(1), of the filing date of Provisional Application No. 60/630,206 filed on Nov. 24, 2004, pursuant to 35 U.S.C. §111(b).

TECHNICAL FIELD

The present invention relates to a Group III nitride semiconductor light-emitting device and, specifically, to a group III nitride semiconductor light-emitting device with improved emission efficiency.

BACKGROUND ART

Group III nitride semiconductors have conventionally been utilized as functional materials for constructing Group III nitride semiconductor light-emitting devices having a pn junction-type structure, such as light-emitting diodes (LEDs) and laser diodes (LDs), which radiate short-wavelength visible light (for example, see Japanese Unexamined Patent Publication No. 2000-332364). For example, for constructing LEDs exhibiting light emission in the near-ultraviolet, blue or green bands, n-type or p-type aluminum gallium nitride ($Al_XGa_YN$: $0 \leq X, Y \leq 1$, $X+Y=1$) is used to form the clad layer (for example, see Japanese Unexamined Patent Publication No. 2003-229645). Also, gallium indium nitride ($Ga_YIn_ZN$: $0 \leq Y$, $Z \leq 1$, $Y+Z=1$) is utilized to form the light-emitting layer (for example, see Japanese Examined Patent Publication No. 55-3834).

In conventional Group III nitride semiconductor light-emitting devices, it is common to provide an n-type or p-type Group III nitride semiconductor layer in conjunction with the light-emitting layer. The emission component is constructed as a hetero-junction structure in order to obtain high emission intensity. For example, for constructing an emission component with a double hetero (DH) junction structure, conventionally, the light-emitting layer is composed of $Ga_YIn_ZN$ ($0 \leq Y$, $Z \leq 1$, $Y+Z=1$) and the n-type or p-type Group III nitride semiconductor layer is bonded as a clad layer or the like (for example, see Akazakai I., "Group III-V Compound Semiconductors", May 20, 1995, Baifukan, Chap. 13).

A light-emitting layer has also been proposed which employs a quantum well structure for improved emission efficiency. Currently marketed light-emitting devices such as blue LEDs and violet laser diodes employ lattice misfit materials formed by laminating different types of semiconductor layers with different lattice constants. Sapphire is generally used as the substrate for Group III nitride semiconductor light-emitting devices, with a GaN layer generally used as the n-type layer and a GaInN-based quantum well structure as the light-emitting layer.

In such light-emitting devices, the a-axis lattice constant of the light-emitting layer is considered to be roughly equivalent to the a-axis lattice constant of the n-type layer under it (coherent growth). Generally, coherent growth occurs when the film thickness of the light-emitting layer is thinner than the critical film thickness, as in a quantum well structure, and relaxed growth occurs when it is thicker than the critical film thickness.

Also, conventional techniques are known for preventing deterioration in characteristics due to distortion, by specifying a range for the average degree of distortion of the a-axis lattice constant of the GaN layer in a laminated structure comprising an n-type layer, light-emitting layer and p-type layer on a sapphire substrate (for example, see Japanese Unexamined Patent Publication No. 2002-124702).

DISCLOSURE OF INVENTION

It is an object of the present invention to provide a Group III nitride semiconductor light-emitting device with high emission efficiency.

As a result of using reciprocal lattice space mapping with X-ray diffraction for detailed analysis of light-emitting devices employing lattice misfit materials obtained by lamination of different types of semiconductor layers with different lattice constants, the present inventors have discovered that the a-axis lattice constants of the light-emitting layer and the layer between the light-emitting layer and the substrate differ depending on the laminated structure and the growth conditions, and that a slight difference (deviation) is produced in these a-axis lattice constants. The present inventors further discovered that the shift (deviation) in the a-axis lattice constants has a major effect on the emission efficiency, and have thereupon completed this invention.

Specifically, the present invention provides the following.

(1) A Group III nitride semiconductor light-emitting device having an n-type layer, a light-emitting layer and a p-type layer composed of a Group III nitride semiconductor on a substrate, with the light-emitting layer sandwiched between the n-type layer and p-type layer, wherein the range for $\Delta a$ as the ratio of the difference between the a-axis lattice constant of the layer between the light-emitting layer and substrate (or in the case of multiple layers with different compositions between the light-emitting layer and substrate, where each layer is grouped according to composition, the a-axis lattice constant of the group having the maximum thickness considering all of the layers belonging to the group) $a_1$ and the a-axis lattice constant of the light-emitting layer (or if the light-emitting layer has a multiple quantum well structure, the a-axis lattice constant determined from the zero-order peak representing the average composition of the well layers and barrier layers) $a_2$, represented by the following formula (I), is $-0.05 \leq \Delta a \leq 0.05$ (unit: %).

$$\Delta a = 100(a_1 - a_2)/a_1 \qquad (1)$$

(2) A Group III nitride semiconductor light-emitting device according to (1) above, wherein the Group III nitride semiconductor is represented by the formula $Al_XGa_YIn_ZN_{1-A}M_A$ ($0 \leq X \leq 1$, $0 \leq Y \leq 1$, $0 \leq Z \leq 1$ and $X+Y+Z=1$, wherein M represents a Group V element different from nitrogen (N), and $0 \leq A < 1$).

(3) A Group III nitride semiconductor light-emitting device according to (1) or (2) above, wherein the substrate is sapphire.

(4) A Group III nitride semiconductor light-emitting device according to any one of (1) to (3) above, wherein the layer between the light-emitting layer and the substrate (or in the case of multiple layers with different compositions between the light-emitting layer and substrate, where each layer is grouped according to composition, the group having the maximum thickness considering all of the layers belonging to the group) is an n-type GaN layer.

(5) A Group III nitride semiconductor light-emitting device according to any one of (1) to (4) above, wherein the light-emitting layer has a multiple quantum well structure.

(6) A Group III nitride semiconductor light-emitting device according to (5) above, wherein the barrier layer of the multiple quantum well structure is composed of $Al_XGa_YIn_ZN$ ($0 \leq X \leq 1$, $0 \leq Y \leq 1$, $0 \leq Z \leq 1$, $X+Y+Z=1$), and the well layer is composed of $Ga_YIn_ZN$ ($0<Y<1$, $0<Z<1$, $Y+Z=1$).

(7) A Group III nitride semiconductor light-emitting device according to (1) above, wherein the substrate is sapphire, the layer between the light-emitting layer and the substrate (or in the case of multiple layers with different compositions between the light-emitting layer and substrate, where each layer is grouped according to composition, the group having the maximum thickness considering all of the layers belonging to the group) is an n-type GaN layer, the light-emitting layer has a multiple quantum well structure wherein the barrier layer is composed of $Al_XGa_YIn_ZN$ ($0 \leq X \leq 1$, $0 \leq Y \leq 1$, $0 \leq Z \leq 1$, $X+Y+Z=1$) and the well layer is composed of $Ga_YIn_ZN$ ($0 \leq Y \leq 1$, $0 \leq Z \leq 1$, $Y+Z=1$), and the lattice constants $a_1$ and $a_2$ are larger than 3.181 Å.

(8) A Group III nitride semiconductor light-emitting device according to any one of (1) to (7) above, wherein the thickness of the layer between the light-emitting layer and the substrate (or in the case of multiple layers with different compositions between the light-emitting layer and substrate, where each layer is grouped according to composition, the group having the maximum thickness considering all of the layers belonging to the group) is 1-20 µm.

(9) A lamp comprising a Group III nitride semiconductor light-emitting device according to any one of (1) to (8) above.

A light-emitting device with high emission efficiency, wherein the ratio of the difference between the a-axis lattice constants of the layer between the light-emitting layer and substrate and the light-emitting layer is controlled to within a specified range, can be obtained by the present invention.

BEST MODE FOR CARRYING OUT THE INVENTION

Figure 1:
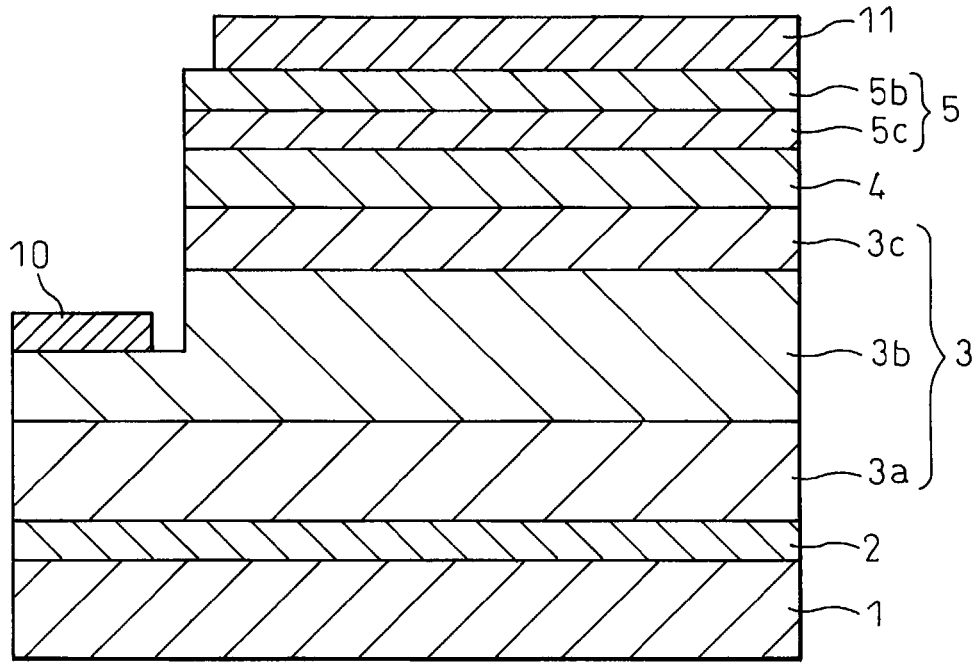
FIG. 1 is a schematic view of an embodiment of a Group III nitride semiconductor light-emitting device of the invention.

FIG. 1 is a schematic view of an embodiment of a Group III nitride semiconductor light-emitting device of the invention.

In FIG. 1, 1 is a substrate, 2 is a buffer layer and 3 is an n-type layer, which is composed of an underlying layer (3a), an n-contact layer (3b) and an n-clad layer (3c). 4 is a light-emitting layer, and 5 is a p-type layer which is composed of a p-clad layer (5c) and a p-contact layer (5b). 10 is an n-ohmic electrode, and 11 is a p-ohmic electrode. The buffer layer may be omitted depending on the type of substrate. Also, the n-contact layer may serve as the underlying layer and/or the n-clad layer as well. The p-contact layer may also serve as the p-clad layer as well.

In the light-emitting device example described above, the "layers between the light-emitting layer and the substrate" according to the invention are the buffer layer (2) and n-type layer (3). If the compositions of the Group III nitride semiconductors composing these layers are the same, then the a-axis lattice constant is $a_1$ as defined by the invention. If all of the compositions of the Group III nitride semiconductors composing these layers are different, then the a-axis lattice constant of the thickest layer among these layers is $a_1$ as defined by the invention. Normally, the buffer layer (2) and n-type clad layer (3c) are thin and the underlying layer (3a) and n-type contact layer (3b) are thick, and therefore the a-axis lattice constant of the thicker of the underlying layer or n-type contact layer is $a_1$ as defined by the invention. When the compositions of the Group III nitride semiconductors composing any two layers are the same, their layer thicknesses are totaled and compared with the thicknesses of the other layers, and the a-axis lattice constant of the thickest layer is $a_1$ as defined by the invention. In other words, when multiple layers with different compositions are present between the light-emitting layer and the substrate, each layer is grouped according to composition, and the a-axis lattice constant of the group having the maximum thickness as the total thickness of all the layers belonging to the group is $a_1$ as defined by the invention.

The light-emitting layer may be constructed from a single $Ga_YIn_ZN$ ($0<Y$, $Z<1$, $Y+Z=1$) layer, or it may have a super lattice structure known as a quantum well structure. A quantum well structure has alternately laminated barrier and well layers, with light emission in the well layers. The quantum well structure may be a single quantum well structure having a single well layer, or it may be a multiple quantum well structure having multiple well layers. For example, in the case of only one light-emitting layer such as in a single quantum well structure, the a-axis lattice constant of the light-emitting layer is $a_2$ as defined by the invention. In the case of a multiple quantum well structure, the a-axis lattice constant determined from the zero-order peak representing the average composition of the well layers and barrier layers is $a_2$ as defined by the invention.

According to the invention, the a-axis lattice constant of each layer is determined from reciprocal lattice space mapping of an asymmetrical surface in X-ray diffraction. This method will be explained below, using the light-emitting device fabricated in Example 1 for reference (the cross-sectional structure is shown in FIG. 2).

Figure 2:
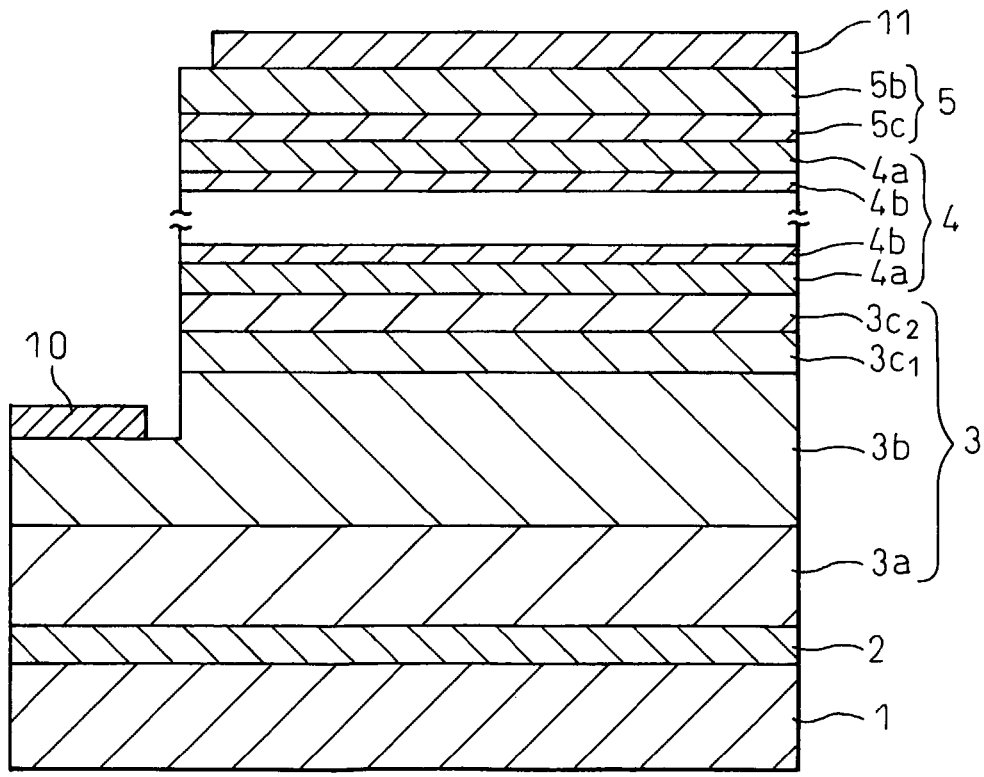
FIG. 2 is a schematic diagram showing the cross-sectional structure of the Group III nitride semiconductor light-emitting device fabricated in Example 1.
Figure 3:
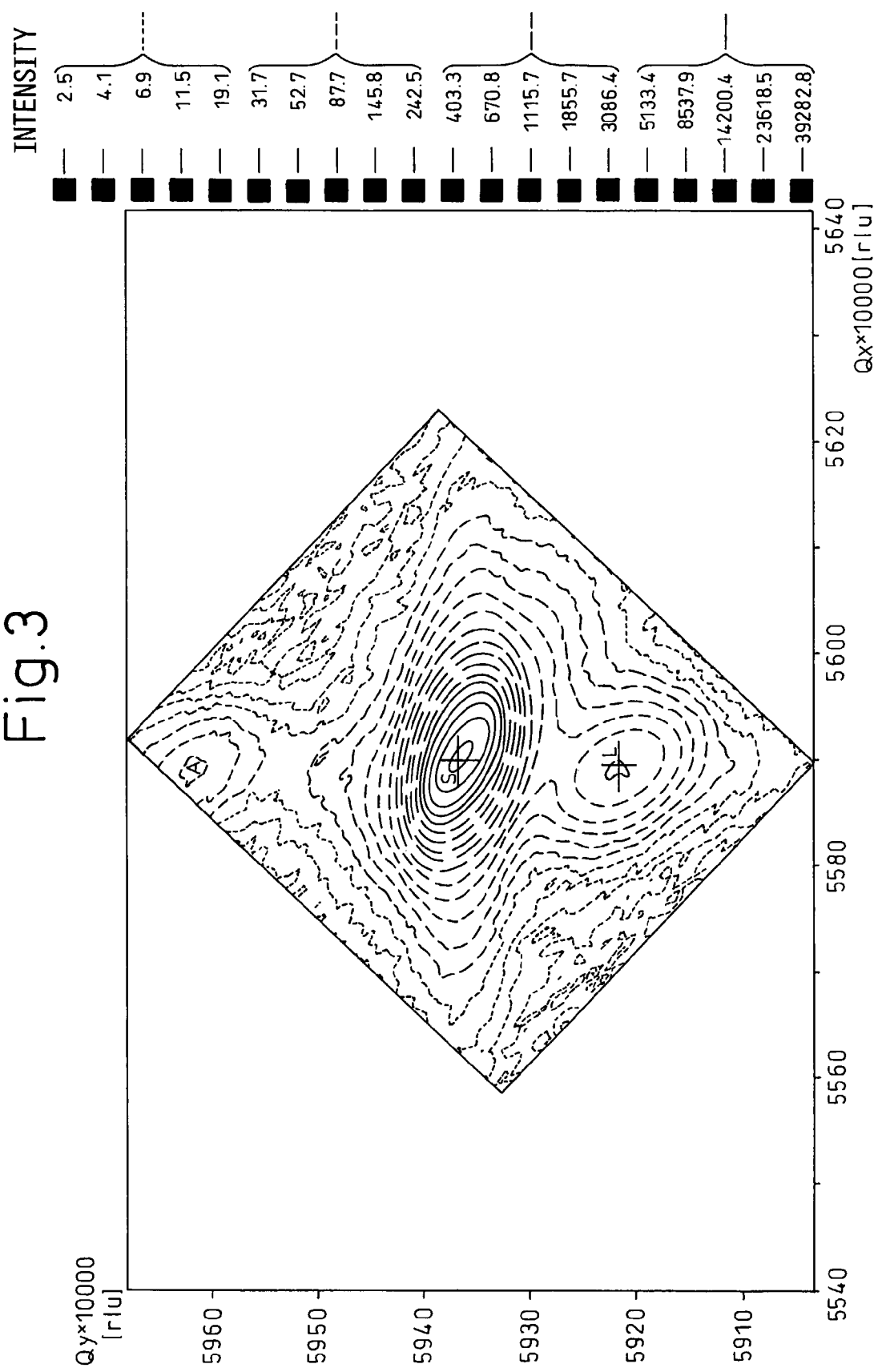
FIG. 3 is a reciprocal lattice space mapping for the asymmetrical plane of the Group III nitride semiconductor light-emitting device fabricated in Example 1.

FIG. 3 shows reciprocal lattice space mapping of the light-emitting device fabricated in Example 1, described hereunder (the cross-sectional structure is shown in FIG. 2). The conditions for the X-ray diffraction apparatus used for the measurement shown in FIG. 3 are described below.

The X-ray diffraction apparatus used was an X' Pert-PRO MRD by PANalytical, and the analysis software was X' Pert Epitaxy 4.1.

1. Incident optical system
   X-ray generator: Ceramic insulated X-ray diffraction Cu tube, Maximum output of 1.8 kW Monochrometer: Ge hybrid double-diffraction monochrometer (The diffusion beam from the X-ray bulb was converted to a monochromatic parallel beam by the hybrid monochrometer.)

2. Receiver optical system
   Triple axis module: resolution 12 seconds
   X-ray detector: Proportional counter
3. Other
   Goniometer: High-precision direct encoder-linked goniometer
   Angle reproducibility: 0.0001°
   Sample stage: In-plane rotation, pitch angle and X, Y, Z axes all motor driven
4. Reciprocal lattice mapping measurement conditions
   X-ray source: 45 kV voltage, 40 mA current
   Incident slit: ⅛", (X-ray beam diameter: 10 mm length× 0.365 mm width)
   Sample shape: 2-inch wafer
   Diffraction plane: (20-24) plane In FIG. 3, the horizontal axis Qx and vertical axis Qy are both shown in reciprocal lattice units, with the horizontal axis Qx corresponding to the reciprocal of the lattice constant a in the direction parallel to the growth plane, and the vertical axis Qy corresponding to the reciprocal of the lattice constant c normal to the growth plane. For example, a large Qx, Qy means a small lattice constant, while a small Qx, Qy means a large lattice constant. (The Qx and Qy of AlGaN which has a smaller lattice constant than GaN is larger than GaN. On the other hand, the Qx and Qy of GaInN which has a larger lattice constant than GaN is smaller than GaN.)

In the light-emitting device fabricated in Example 1, as clearly seen in FIG. 2, the layers between the light-emitting layer (4) and the substrate (1) are the buffer layer (2) and n-type layer (3). Of these, the underlying layer (3a) and n-contact layer (3b) are composed of GaN, and their compositions are identical. Their total thickness is 10 µm, which is markedly greater than the other layers. Thus, the diffraction peak is the peak S having the highest strength at the center of FIG. 3, and its a-axis lattice constant is $a_1$ as defined by the invention. Normally in a Group III nitride semiconductor light-emitting device, the light-emitting layer and the p-type layer are thin while the n-type layer is thick. The diffraction peak based on the thickest layer in the n-type layer has the strongest intensity.

Also, the well layer (4b) of the light-emitting layer (4) having a multiple quantum well structure is composed of GaInN and, as GaInN has a larger lattice constant than GaN which composes the underlying layer (3a) and n-contact layer (3b), the zero-order peak representing the average composition of the multiple quantum well structure of the light-emitting layer is the peak L under S in FIG. 3, and its a-axis lattice constant is $a_2$ as defined by the invention. Incidentally, peak A above S in FIG. 3 has a smaller lattice constant than GaN, and it is the diffraction peak of the AlGaN composing the p-clad layer.

As explained above, $a_1$ and $a_2$ can be calculated by considering the position and strength of each peak in the obtained reciprocal lattice space mapping as well as the composition and thickness of each layer composing the light-emitting device. As sapphire is used as the substrate in Example 1, the layers between the light-emitting layer and substrate are n-type layers, but when SiC, for example, is used as the substrate, p-type layers may be formed between the light-emitting layer and substrate. In this case as well, $a_1$ and $a_2$ may be determined by the same method.

The a-axis lattice constants of the n-type layer and light-emitting layer were determined by applying the asymmetrical (20-24) plane to the diffraction plane for measurement in FIG. 3, and measuring the reciprocal lattice space mapping, but the (10-15) plane may be used instead of the (20-24) plane for the diffraction plane. Particularly, as, in an ultraviolet emitting device, the In composition of the light-emitting layer is low and the structure approaches that of the GaN of the underlying layer, the peak separation of the underlying layer and light-emitting layer becomes indistinct and it is preferred to use a diffraction plane distant from the origin of the reciprocal lattice space mapping. The (10-15) plane is effective for an ultraviolet emitting device. For accurate calculation of the lattice constant, the sample temperature (room temperature for measurement at room temperature) is preferably kept consistent each time.

According to the invention, the ratio of the difference between $a_1$ and $a_2$ defined above, or $\Delta a = 100(a_1-a_2)/a_1$, is controlled to within $-0.05 \leq \Delta a \leq 0.05$ (unit: %). This will improve the efficiency of the light-emitting device. More preferably, $\Delta a$ is controlled to within $-0.03 \leq \Delta a \leq 0.03$ (unit: %).

Control of $\Delta a$ can be accomplished by controlling the laminated structure and growth conditions of the Group III nitride semiconductor layer. For example, for growth of a Group III nitride semiconductor, $\Delta a$ varies considerably depending on the molar ratio of Group V materials and Group III materials (V/III ratio). A large V/III ratio tends to produce a small $\Delta a$. The V/III ratio for growth of the layers between the light-emitting layer and substrate will also differ depending on other conditions, but is generally preferred to be 300-1600. At less than 300, $\Delta a$ increases and often exceeds 0.05. At greater than 1600, crystallization of the Group III nitride semiconductor becomes poor, and $\Delta a$ often is less than −0.05. A more preferred range is 400-800.

The V/III ratio for growth of the light-emitting layer (or the well layer in the case of a quantum well structure) will also differ depending on other conditions, but is generally preferred to be 70,000-190,000. At less than 70,000, $\Delta a$ increases and often exceeds 0.05. At greater than 190,000, $\Delta a$ often is less than −0.05. A more preferred range is 80,000-150,000.

The value of $\Delta a$ is also affected by the thickness of the layers between the light-emitting layer and substrate. Normally, a larger thickness results in $\Delta a$ approaching zero. Although it will depend also on the growth conditions of the Group III nitride semiconductor, the thickness is generally preferred to be 6-16 µm. At less than 5 µm, $\Delta a$ will usually not fall between the range of $-0.05 \leq \Delta a \leq 0.05$ (unit: %). The effect of lowering $\Delta a$ is minimal if the thickness exceeds 16 µm, and the cost increases. A more preferred range is 8-12 µm.

The value of $\Delta a$ is also affected by the dislocation density of the layer between the light-emitting layer and substrate. A smaller dislocation density results in $\Delta a$ approaching zero. This means that the growth mode of the light-emitting layer varies depending on the dislocation density of the layer between the light-emitting layer and the substrate, with a large dislocation density resulting in deviation from coherent growth. The dislocation density is generally preferred to be no greater than $1 \times 10^9/\text{cm}^2$.

When the light-emitting layer has a quantum well structure, $\Delta a$ can also be controlled by the thickness and dopant concentration of the barrier layer. A thicker barrier layer will tend to increase $\Delta a$. The preferred range is 10-25 nm. A thickness of less than 10 nm is not preferred because $\Delta a$ will usually be smaller than −0.05%, while a thickness of greater than 25 nm is not preferred because $\Delta a$ will usually be larger than 0.05%.

If the dopant concentration of the barrier layer is decreased, $\Delta a$ will tend to be smaller than $-0.05\%$. While it will depend on the other conditions as well, the dopant concentration of the barrier layer is preferably $1\times10^{17}$-$1\times10^{18}/cm^3$. With excessive doping at greater than $1\times10^{18}/cm^3$, the crystallinity of the barrier layer becomes poor and the electrical characteristics may be impaired. With an undoped barrier layer, or doping at less than $1\times10^{16}/cm^3$, $\Delta a$ will usually be smaller than $-0.05\%$. As dopants to be added to the barrier layer there may be mentioned Si and Ge.

Numerous Group III nitride semiconductors are known, such as those represented by the formula $Al_XGa_YIn_ZN_{1-A}M_A$ ($0\leq X\leq 1$, $0\leq Y\leq 1$, $0\leq Z\leq 1$ and $X+Y+Z=1$, wherein M represents a Group V element different from nitrogen (N), and $0\leq A<1$) and, according to the invention, there may be used, without any particular restrictions, Group III nitride semiconductors represented by the formula $Al_XGa_YIn_ZN_{1-A}M_A$ ($0\leq X\leq 1$, $0\leq Y\leq 1$, $0\leq Z\leq 1$, $X+Y+Z=1$. M represents a Group V element different from nitrogen (N) and $0\leq A<1$), which include the aforementioned well-known Group III nitride semiconductors.

The Group III nitride semiconductor may contain other Group III elements in addition to Al, Ga and In and, if necessary, elements such as Ge, Si, Mg, Ca, Zn, Be, P, As and B may be included. These are not limited to intentionally added elements, and may be unavoidable impurities which depend on the film-forming conditions, etc. or trace impurities included in the starting materials and reactor materials.

There are no particular restrictions on the growth method for the Group III nitride semiconductor, and any method known to grow a Group III nitride semiconductor may be applied, such as MOCVD (metal-organic chemical vapor deposition), HVPE (hybrid vapor phase epitaxy) or MBE (molecular beam epitaxy). MOCVD is a preferred growth method from the standpoint of film thickness control and productivity. In MOCVD, hydrogen ($H_2$) or nitrogen ($N_2$) is used as the carrier gas, trimethylgallium (TMGa) or triethylgallium (TEGa) is used as the Ga source (Group III material), trimethylaluminum (TMAl) or triethylaluminum (TEAl) is used as the Al source (Group III material), trimethylindium (TMIn) or triethylindium (TEIn) is used as the In source (Group III material), and ammonia ($NH_3$) or hydrazine ($N_2H_4$) is used as the N source (Group V material). The dopant used, for the n-type layer, may be monosilane ($SiH_4$) or disilane ($Si_2H_6$) as the Si source and germanium gas ($GeH_4$) or an organic germanium compound such as tetramethylgermanium (($CH_3$)$_4$Ge) or tetraethylgermanium (($C_2H_5$)$_4$Ge) as the Ge source, for the n-type layer. In MBE, elemental germanium may be utilized as the doping source. For the p-type layer, for example, biscyclopentadienylmagnesium ($Cp_2Mg$) or bisethylcyclopentadienylmagnesium (($EtCp$)$_2Mg$) is used as the Mg source.

For the substrate (1) there may be used, without any particular restrictions, substrate materials including oxide single crystals such as sapphire single crystal ($Al_2O_3$; A plane, C plane, M plane, R plane), spinel single crystal ($MgAl_2O_4$), ZnO single crystal, $LiAlO_2$ single crystal, $LiGaO_2$ single crystal or MgO single crystal, or Si single crystal, SiC single crystal, GaAs single crystal, AlN single crystal, GaN single crystal and $ZrB_2$ or other boride single crystals. The plane direction of the substrate is not particularly restricted. The crystal plane of the substrate may be inclined toward to a specific crystal plane or not inclined.

For lamination of a gallium nitride-based compound semiconductor on the aforementioned substrate which, in principle, does not match lattices with gallium nitride-based compounds, except for a GaN substrate, the buffer layer (2) may be formed using the low-temperature buffer method disclosed in Japanese Patent Publication No. 3026087 or Japanese Unexamined Patent Publication No. 4-297023 or the lattice mismatch crystal epitaxial growth technique, or Seeding Process (SP), disclosed in Japanese Unexamined Patent Publication No. 2003-243302 and elsewhere. The SP method for fabrication of AlN crystal films at temperatures high enough to allow fabrication of GaN-based crystals is a particularly superior lattice mismatch crystal epitaxial growth technique from the viewpoint of improved productivity.

The buffer layer (2) is composed of an $Al_XGa_{1-X}N$ layer ($0\leq X\leq 1$), and the thickness of the buffer layer is preferably 0.001-1 μm, more preferably 0.005-0.5 μm and most preferably 0.01-0.2 μm. A thickness within this range will yield a satisfactory crystal morphology of the Group III nitride semiconductor subsequent to the n-type layer (3) which is grown thereover, and will improve the crystallinity.

The buffer layer may be formed by MOCVD. The growth temperature is preferably 400-1200° C., and more preferably 900-1200° C. A growth temperature within this range is preferred because it will result in a single crystal of AlN and satisfactory crystallinity of the Group III nitride semiconductor grown thereover.

The n-type layer (3) is usually composed of an underlying layer (3a), n-contact layer (3b) and n-clad layer (3c). The underlying layer is preferably composed of an $Al_XGa_{1-X}N$ layer ($0\leq x\leq 1$, preferably $0\leq x\leq 0.5$, more preferably $0\leq x\leq 0.1$). The thickness is preferably at least 0.1 μm, more preferably at least 0.5 μm and even more preferably at least 1 μm. A thickness above this range will tend to yield an $Al_XGa_{1-X}N$ layer with satisfactory crystallinity. The upper limit for the thickness of the underlying layer is not particularly restricted for the purpose of the invention.

The underlying layer may be doped with an n-type impurity in the range of $1\times10^{17}$-$1\times10^{19}/cm^3$, but an undoped layer ($<1\times10^{17}/cm^3$) is preferred from the standpoint of maintaining satisfactory crystallinity. There are no particular restrictions on the n-type impurity, and as examples there may be mentioned Si, Ge and Sn, among which Si and Ge are preferred.

The growth temperature for growth of the underlying layer is preferably 800-1200° C. and more preferably 1000-1200° C. Growth within this growth temperature range will result in satisfactory crystallinity. The pressure in the MOCVD growth furnace is adjusted to 15-40 kPa.

The n-contact layer (3b) is preferably composed of an $Al_XGa_{1-X}N$ layer ($0\leq x\leq 1$, preferably $0\leq x\leq 0.5$, more preferably $0\leq x\leq 0.1$). It is preferably doped with an n-type impurity, and preferably the n-type impurity concentration is $1\times10^{17}$-$1\times10^{19}/cm^3$ and more preferably $1\times10^{18}$-$1\times10^{19}/cm^3$, from the standpoint of maintaining satisfactory ohmic contact with the n-ohmic electrode, controlling generation of cracks and maintaining satisfactory crystallinity. There are no particular restrictions on the n-type impurity, and as examples there may be mentioned Si, Ge and Sn, among which Si and Ge are preferred.

The Group III nitride semiconductors composing the underlying layer and n-contact layer preferably have the same composition, and the total thickness is preferably set within a range of 2-20 μm, more preferably 4-20 μm and even more preferably 8-20 μm. A thickness within this range will help reduce the ratio ($\Delta a$) of the difference between the a-axis lattice constant of the underlying layer and n-contact layer and the a-axis lattice constant of the light-emitting layer, and yield an device with high emission efficiency. This range is also preferred from the standpoint of maintaining satisfactory crystallinity.

An n-clad layer ($3c$) is preferably provided between the n-contact layer ($3b$) and light-emitting layer (4), because it can fill areas of distorted flatness of the outermost surface of the n-contact layer. The n-clad layer may be formed of AlGaN, GaN, GaInN or the like. There may also be formed a super lattice structure as a hetero-junction or multiple lamination of these structures. When GaInN is used, it is naturally preferred for it to have a larger band gap than the GaInN of the light-emitting layer.

For an ultraviolet light-emitting device, an AlGaN layer is preferably used for the n-clad layer from the standpoint of enclosing the carrier. While there are no particular restrictions so long as it can enclose the carrier in the light-emitting layer, the composition is preferably $Al_bGa_{1-b}N$ ($0<b<0.4$, preferably $0.05<b<0.2$). An n-clad layer satisfying these conditions is preferred from the standpoint of enclosing the carrier in the light-emitting layer. An AlGaN clad layer is not necessary for a blue light-emitting device.

The thickness of the n-clad layer is not particularly restricted, but is preferably 0.005-0.5 μm and more preferably 0.005-0.1 μm. The n-type dope concentration of the n-clad layer is preferably $1\times10^{17}$-$1\times10^{20}$/cm$^3$ and more preferably $1\times10^{18}$-$1\times10^{19}$/cm$^3$. A dope concentration within this range is preferred from the standpoint of maintaining satisfactory crystallinity and lowering the operating voltage of the device.

The light-emitting layer (4) is a Group III nitride semiconductor, and preferably the Group III nitride semiconductor $Ga_{1-s}In_sN$ ($0\leq s\leq 0.4$). The thickness of the light-emitting layer is not particularly restricted, but a thickness obtained by quantum effect, i.e. a critical film thickness, is suitable, and the thickness is preferably, for example, 1-10 nm and more preferably 2-6 nm. A thickness within this range is preferred from the standpoint of emission output. If the thickness is greater than the critical thickness, the lattice constant shift ($\Delta a$) between the n-type layer and light-emitting layer will increase, impairing the emission characteristics. The light-emitting layer may have a single quantum well (SQW) structure as described above, or a multiple quantum well (MQW) structure comprising the aforementioned $Ga_{1-s}In_sN$ as the well layer and an $Al_cGa_{1-c}N$ ($0\leq c<0.3$ and $b>c$) barrier layer with a larger band gap energy than the well layer. The well layer and barrier layer may also be doped with impurities.

The growth temperature of the $Al_cGa_{1-c}N$ barrier layer is preferably a temperature of at least 700° C. and more preferably 800-1100° C., for satisfactory crystallinity. The GaInN well layer is preferably grown at 600-900° C. and more preferably 700-900° C. That is, the growth temperature is preferably varied between layers for satisfactory MQW crystallinity.

The p-type layer (5) is normally composed of a p-clad layer (5c) and a p-contact layer (5b). The p-clad layer (5c) is not particularly restricted so long as it has a composition with a larger band gap energy than the light-emitting layer and encloses the carrier in the light-emitting layer, but it is preferably $Al_dGa_{1-d}N$ ($0<d\leq 0.4$, preferably $0.1\leq d\leq 0.3$). A p-clad layer composed of this type of AlGaN is preferred from the standpoint of enclosing the carrier in the light-emitting layer. The thickness of the p-clad layer is not particularly restricted, but is preferably 0.01-0.4 μm and more preferably 0.02-0.1 μm. The p-type dope concentration of the p-clad layer is preferably $1\times10^{18}$-$1\times10^{21}$/cm$^3$ and more preferably $1\times10^{19}$-$1\times10^{20}$/cm$^3$. A p-type dope concentration within this range will yield a satisfactory p-type crystal without reduction in crystallinity.

The p-contact layer (5b) is a Group III nitride semiconductor layer comprising at least $Al_eGa_{1-e}N$ ($0\leq e\leq 0.3$, preferably $0\leq e\leq 0.2$, more preferably $0\leq e\leq 0.1$). An Al composition within this range is preferred from the standpoint of maintaining satisfactory crystallinity and satisfactory ohmic contact with the p-ohmic electrode. A p-type dopant concentration of $1\times10^{18}$-$1\times10^{21}$/cm$^3$ and especially $1\times10^{19}$-$5\times10^{20}$/cm$^3$ is preferred from the standpoint of maintaining satisfactory ohmic contact, preventing generation of cracks and maintaining satisfactory crystallinity. The p-type impurity is not particularly restricted, but Mg, for example, is preferred. The thickness is also not particularly restricted, but is preferably 0.01-0.5 μm and more preferably 0.05-0.25 μm. A thickness within this range is preferred from the standpoint of emission output.

The n-contact layer (3b) and p-contact layer (5b) are provided with an n-ohmic electrode (10) and p-ohmic electrode (11), respectively, by well-known means employed in this technical field. The structure of each may be any structure including conventionally publicly known structures, without any restrictions.

As the Group III nitride semiconductor light-emitting device of the invention has excellent emission efficiency, it is possible to fabricate a high-brightness LED lamp from the light-emitting device. Thus, chips fabricated by this technique can be employed to allow low-power driving, and to thus realize superior characteristics, for electronic devices such as cellular phones, displays and panels, and machines and appliances such as automobiles, computers and game devices incorporating such electronic devices. A particular effect of power savings is exhibited for battery-driven devices such as cellular phones, game devices, gadgets and automobile parts.

EXAMPLES

The present invention will now be explained in greater detail through examples and comparative examples, with the understanding that these examples are in no way limitative on the invention.

Example 1

FIG. 2 is a schematic diagram showing the cross-sectional structure of the Group III nitride semiconductor light-emitting device fabricated in this example. Numeral 1 is the (0001)-sapphire substrate, and 2 is a buffer layer made of AlN with a thickness of a few nanometers. Numeral 3 is an n-type layer, which is composed of an underlying layer 3a made of GaN with a thickness of 8 μm, an Si-doped n-contact layer 3b made of GaN with a thickness of 2 μm, an Si-doped first n-clad layer $3c_1$ made of $Al_{0.07}Ga_{0.93}N$ with a thickness of 10 nm and an Si-doped second n-clad layer $3c_2$ made of $Ga_{0.95}In_{0.05}N$ with a thickness of 20 nm. Numeral 4 is a light-emitting layer, which has a multiple quantum well structure in a 5-cycle construction with alternate lamination of an Si-doped barrier layer 4a made of GaN with a thickness of 16 nm and well layer 4b made of $Ga_{0.90}In_{0.05}N$ with a thickness of 3 nm. Numeral 5 is a p-type layer, composed of a Mg-doped p-clad layer 5c made of $Al_{0.15}Ga_{0.85}N$ with a thickness of 35 nm and a Mg-doped p-contact layer 5b made of GaN with a thickness of 100 nm. Numeral 10 is an n-ohmic electrode, and 11 is a p-ohmic electrode. Thus, $a_1$ of this light-emitting device as defined by the invention is the a-axis lattice constant of the GaN composing the underlying layer 3a and n-contact layer 3b. Also, $a_2$ is the a-axis lattice constant as calculated from the zero-order peak of the light-emitting layer 4 having the multiple quantum well structure.

An epitaxial laminated structure was formed by the following process using ordinary reduced-pressure MOCVD. First, a (0001)-sapphire substrate 1 was placed on a high-purity graphite semiconductor susceptor heated to the film-forming temperature with a radio-frequent (RF) induction heater. Next, nitrogen gas was circulated into a stainless steel gas-phase growth reactor to purge the reactor.

After circulating nitrogen gas through the gas-phase growth reactor for 8 minutes, the induction heater was activating to raise the temperature of the substrate 1 from room temperature to 600° C. over a period of 10 minutes. Hydrogen gas and nitrogen gas were then circulated through while maintaining the temperature of the substrate 1 at 600° C., to adjust the pressure in the gas-phase growth reactor to 15 kPa. The surface of the substrate 1 was allowed to stand at this temperature and pressure for 2 minutes for thermal cleaning. Upon completion of thermal cleaning, the supply of nitrogen gas to the gas-phase growth reactor was interrupted. The supply of hydrogen gas was continued.

Next, a buffer layer 2 composed of AlN was formed by the Seeding Process. Concretely, the buffer layer 2 was formed by the following process. The temperature of the substrate 1 was raised to 1120° C. in a hydrogen atmosphere. After confirming stabilization at the 1120° C. temperature, hydrogen gas accompanied by trimethylaluminum (TMAl) vapor was supplied to the gas-phase growth reactor for 7 minutes and 30 seconds. This resulted in reaction with the nitrogen (N) atoms produced by decomposition of the nitrogen (N)-containing accumulated precipitate already adhering to the inner wall of the gas-phase reactor, for adhesion of the buffer layer 2 composed of aluminum nitride (AlN) with a thickness of several nanometers on the sapphire substrate. Supply of the hydrogen gas accompanied by TMAl vapor to the gas-phase growth reactor was terminated to complete growth of the buffer layer 2, after which a period of 4 minutes was allowed to pass for complete emission of the TMAl remaining in the gas-phase growth reactor.

Next, supply of ammonia ($NH_3$) gas into the gas-phase growth reactor was initiated, and after elapse of 4 minutes, the temperature of the substrate 1 was lowered to 1040° C. while continuing circulation of ammonia gas. Upon confirming that the temperature of the substrate 1 had reached 1040° C., the temperature was temporarily allowed to stabilize, and supply of trimethylgallium (TMGa) into the gas-phase growth reactor was initiated to form an underlying layer 3a made of undoped GaN to the prescribed thickness. The thickness of the underlying layer 3a was 8 μm.

Next, the temperature of the substrate 1 was raised to 1060° C. and, upon stabilization of the temperature, monosilane ($SiH_4$) gas was used as a dopant gas to form an Si-doped n-contact layer 3b made of GaN to a thickness of 2 μm. The Si doping amount was $7 \times 10^{18}/cm^3$. Also, the V/III ratio during formation of the underlying layer and n-contact layer (the molar flow ratio of TMGa and $NH_3$) was 800.

After forming the n-contact layer 3b, an Si-doped first n-clad layer $3c_1$ made of n-type $Al_{0.07}Ga_{0.93}N$ was formed using trimethylgallium (TMGa) as the gallium source, trimethylaluminum (TMAl) as the aluminum source and monosilane ($SiH_4$) as the dopant gas, while keeping the temperature of the substrate 1 at 1060° C. The thickness of the first n-clad layer $3c_1$ was 10 nm. The Si doping amount was $3 \times 10^{18}/cm^3$.

Next, the temperature of the substrate 1 was lowered to 720° C. and, upon stabilization of the temperature, an Si-doped second n-clad layer $3c_2$ made of $Ga_{0.95}In_{0.05}N$ was formed using triethylgallium (TEGa) as the gallium source, trimethylindium. (TMIn) as the indium source and monosilane ($SiH_4$) gas as the dopant gas. The thickness of the second clad layer $3c_2$ was 20 nm. The Si doping amount was $3 \times 10^{17}/cm^3$.

A light-emitting layer 4 having a multiple quantum well structure in a 5-cycle construction comprising a barrier layer 4a made of GaN and a well layer 4b made of $Ga_{0.90}In_{0.10}N$ was formed on the second n-clad layer $3c_2$. For formation of the light-emitting layer 4 having a multiple quantum well structure, first the barrier layer 4a made of GaN was bonded to the second n-clad layer $3c_2$. The barrier layer 4a was grown using triethylgallium (TEGa) as the gallium source. The thickness was 16 nm, and the layer was Si-doped.

Next, a well layer 4b made of $Ga_{0.90}In_{0.10}N$ was grown using triethylgallium (TEGa) as the gallium source and trimethylindium (TMIn) as the indium source. The thickness was 3 nm, and the layer was undoped. The V/III ratio during formation of the well layer 4b (the molar flow ratio of III (TEGa and TMIn) and V ($NH_3$)) was 140,000.

This procedure was repeated five times and then, finally, a barrier layer 4a was formed to complete the light-emitting layer 4 with a multiple quantum well structure in a 5-cycle construction.

On the light-emitting layer 4 having the multiple quantum well structure there was formed a p-clad layer 5c made of magnesium (Mg)-doped p-type $A_{0.15}Ga_{0.85}N$. The thickness was 35 nm. On the p-clad layer 5c there was formed a p-contact layer 5b made of Mg-doped p-type GaN. Bis-cyclopentadienyl Mg (bis-$Cp_2$Mg) was used as the Mg doping source. The Mg was added in an amount for a positive hole concentration of $8 \times 10^{17}/cm^3$ in the p-contact layer 5b. The thickness of the p-contact layer 5b was 100 nm.

After completing growth of the p-contact layer 5b, current to the induction heater was interrupted to allow the temperature of the substrate 1 to fall to room temperature over a period of about 20 minutes. During the temperature fall, the atmosphere in the gas-phase growth reactor was composed of nitrogen alone, and the $NH_3$ flow rate was reduced. Supply of $NH_3$ was subsequently interrupted. Upon confirming that the temperature of the substrate 1 had fallen to room temperature, the wafer was taken out from the gas-phase growth reactor. At this point, the p-contact layer 5b already exhibited p-type conductivity without an annealing treatment for electrical activation of the p-type carrier (Mg).

Reciprocal lattice space mapping of the asymmetrical surface of the obtained wafer was determined by X-ray diffraction. The obtained reciprocal lattice space mapping is shown in FIG. 3. The following procedure was carried out to determine $a_1$ and $a_3$ from the reciprocal lattice space mapping.

As explained above, peak S in FIG. 3 is the refraction peak from the underlying layer 3a and n-contact layer 3b, and its a-axis lattice constant is $a_1$. Also, the a-axis lattice constant (a) and the reciprocal lattice space mapping horizontal axis (Qx) are in the relationship represented by the following formula.

$$a = (2 \times \lambda/Qx)/3^{1/2}$$

Here, λ is the wavelength (unit: Å) of the X-rays used for measurement, and for this measurement it was 1.54056 Å.

Determining Qx for peak S from FIG. 3 gives a value of Qx=0.558973, and therefore $a_1 = (2 \times \lambda/Qx)/3^{1/2} = 3.18242$ Å.

As also mentioned above, peak L in FIG. 3 is the zero-order peak of the light-emitting layer 4, and since its Qx=0.558913, $a_2$ as determined in the same manner is $a_2$=3.18276 Å.

Thus, $\Delta a = 100(a_1 - a_2)/a_1 = -0.0107\%$.

Next, a photolithography technique and dry etching technique well known in the field were used to expose the surface of the n-contact layer 3b only at the regions where the n-ohmic electrode 10 was to be formed.

Chromium (Cr) and gold (Au) were laminated on the surface of the exposed n-contact layer 3b with the chromium (Cr) on the semiconductor side, to form the n-ohmic electrode 10.

Sputtering and photolithography techniques well known in the field were used for lamination of platinum (Pt), silver (Ag) and gold (Au) in that order from the semiconductor side over the entire surface of the remaining p-contact layer 5b to form a reflective p-ohmic electrode 11.

The wafer was then cut into a square (350 µm×350 µm) LED chip and the chip was bonded to a "submount" wire connection support member, and then the combination was mounted on a lead frame and a gold conductor connected to the lead frame was wired from the lead frame to the LED chip for flow of an device driving current.

The device driving current was introduced through the lead frame to the n-ohmic electrode 10 and p-ohmic electrode 11 in the forward direction. The forward voltage at a 20 mA forward current was 3.1 V. The center wavelength of emitted violet-band luminescence was 412 nm. The emission intensity as measured using an ordinary integrating sphere reached 14 mW with the bare chip, and therefore a Group III nitride semiconductor light-emitting device with high emission intensity had been obtained.

Examples 2 and 3, Comparative Example 1

Group III nitride semiconductor light-emitting devices were fabricated in the same manner as Example 1, except that the V/III ratio during formation of the underlying layer 3a and n-contact layer 3b was 400 in Example 2, 1600 in Example 3 and 200 in Comparative Example 1.

Figure 4:
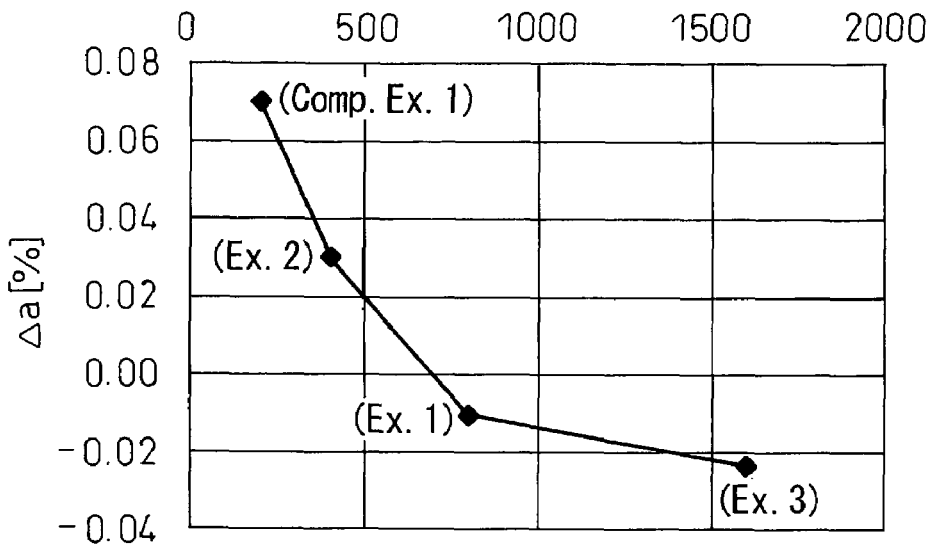
FIG. 4 is a graph plotting the Δa and the V/III ratio during formation of the underlying layer 3a and n-contact layer 3b of the light-emitting devices obtained in Examples 1-3 and Comparative Example 1.
Figure 5:
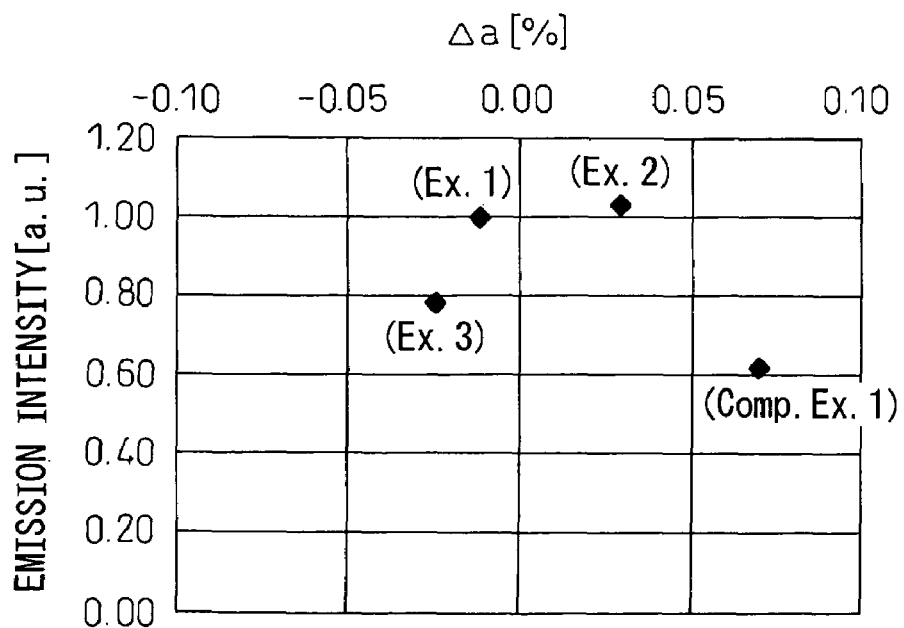
FIG. 5 is a graph plotting the Δa and the emission intensity of the light-emitting devices obtained in Examples 1-3 and Comparative Example 1.

The obtained light-emitting devices were evaluated in the same manner as Example 1. FIG. 4 is a graph plotting the Δa and the V/III ratio during formation of the underlying layer 3a and n-contact layer 3b of the light-emitting devices obtained in Examples 1-3 and Comparative Example 1. FIG. 5 is a graph plotting the Δa and the emission intensity. The emission intensity was expressed as a relative value with 1 as the value for the light-emitting device obtained in Example 1.

FIG. 4 shows that Δa can be controlled by the V/III ratio of the underlying layer 3a and n-contact layer 3b. With an underlying layer and n-contact layer V/III ratio of 200, Δa was a value of 0.07, outside the range of the invention, and the emission intensity was reduced. With underlying layer and n-contact layer V/III ratios of 400-1600, Δa was within the range of the invention and the emission characteristics were satisfactory.

Example 4 and Comparative Example 2

Group III nitride semiconductor light-emitting devices were fabricated in the same manner as Example 1, except that the V/III ratio during formation of the well layer 4b was 83,000 in Example 4 and 46,000 in Comparative Example 2.

Figure 6:
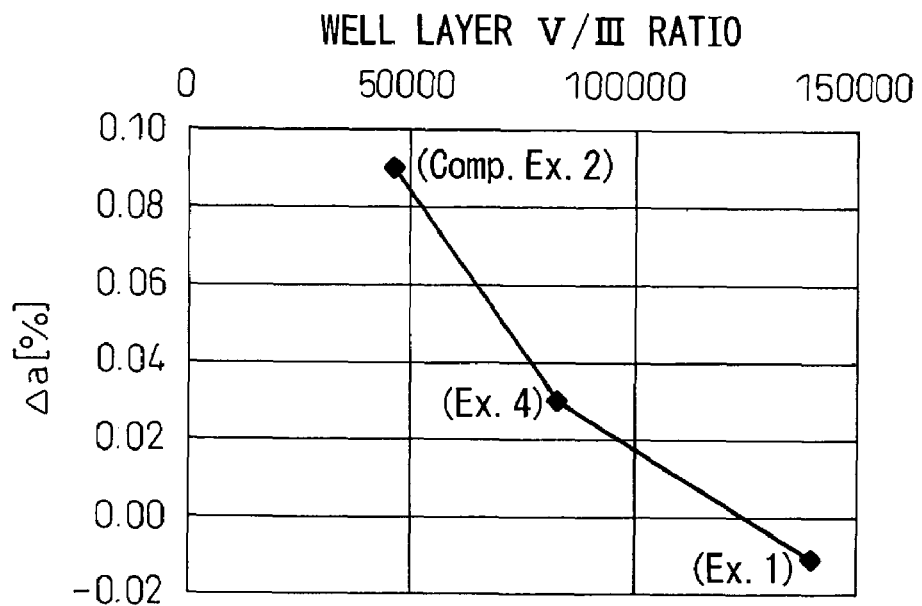
FIG. 6 is a graph plotting the Δa and the V/III ratio during formation of the well layer 4b of the light-emitting devices obtained in Examples 1 and 4 and Comparative Example 2.
Figure 7:
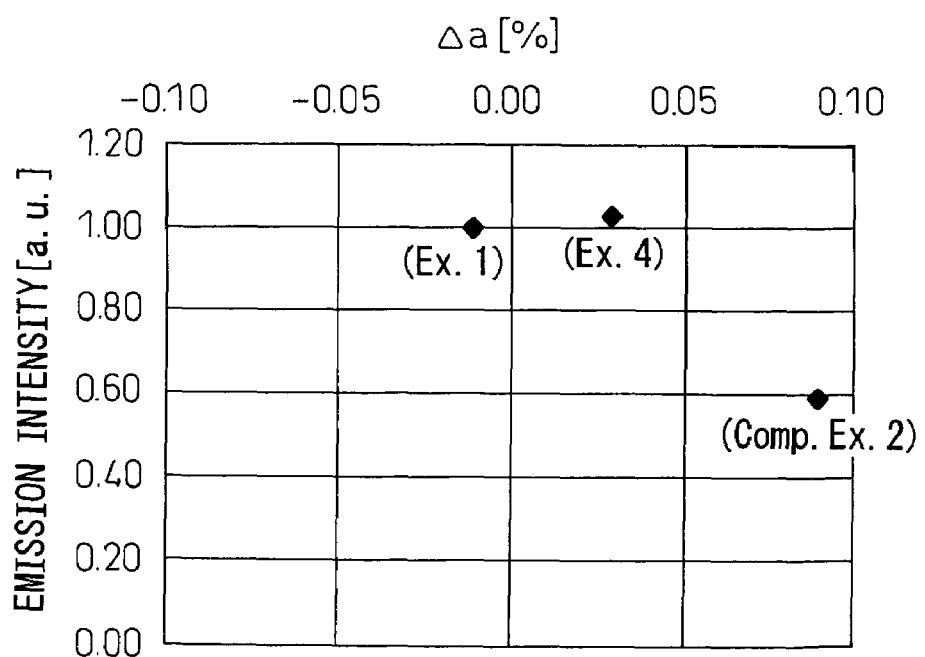
FIG. 7 is a graph plotting the Δa and the emission intensity of the light-emitting devices obtained in Examples 1 and 4 and Comparative Example 2.

The obtained light-emitting devices were evaluated in the same manner as Example 1. FIG. 6 is a graph plotting the Δa and the V/III ratio during formation of the well layer 4b of the light-emitting devices obtained in Examples 1 and 4 and Comparative Example 2. FIG. 7 is a graph plotting the Δa and the emission intensity. The emission intensity was expressed as a relative value with 1 as the value for the light-emitting device obtained in Example 1.

FIG. 6 shows that Δa can be controlled by the V/III ratio of the well layer 4b. With a well layer V/III ratio of 46,000, Δa was outside the range of the invention, and the emission intensity was reduced. With a well layer V/III ratio of 83,000-140,000, Δa was within the range of the invention and the emission characteristics were satisfactory.

Examples 5-8 and Comparative Example 3

Group III nitride semiconductor light-emitting devices were fabricated in the same manner as Example 1, except that the thickness of the underlying layer 3a was 10 µm in Example 5, 14 µm in Example 6, 6 µm in Example 7, 4 µm in Example 8 and 2 µm in Comparative Example 3.

Figure 8:
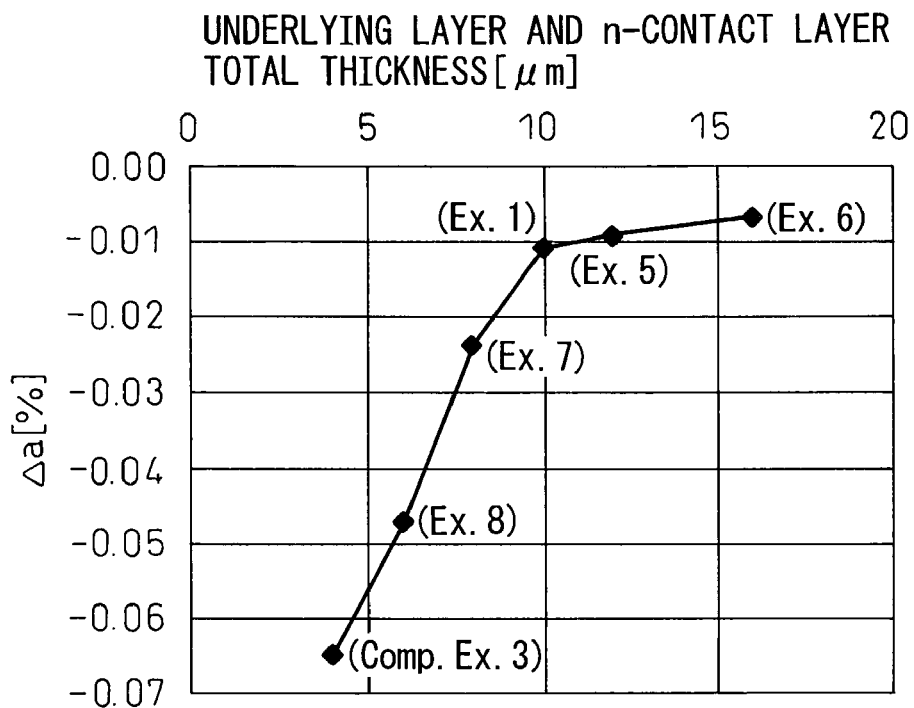
FIG. 8 is a graph plotting the Δa and the total thicknesses of the underlying layer 3a and n-contact layer 3b of the light-emitting devices obtained in Examples 1 and 5-8 and Comparative Example 3.
Figure 9:
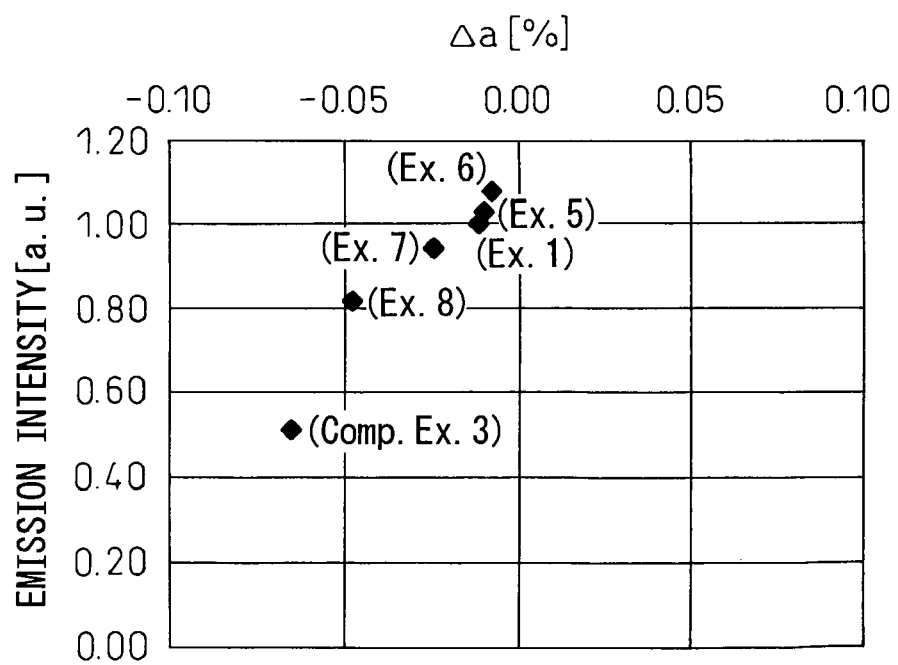
FIG. 9 is a graph plotting the Δa and the emission intensity of the light-emitting devices obtained in Examples 1 and 5-8 and Comparative Example 3.

The obtained light-emitting devices were evaluated in the same manner as Example 1. FIG. 8 is a graph plotting the Δa and the total thicknesses of the underlying layer 3a and n-contact layer 3b of the light-emitting devices obtained in Examples 1 and 5-8 and Comparative Example 3. FIG. 9 is a graph plotting the Δa and the emission intensity. The emission intensity was expressed as a relative value with 1 as the value for the light-emitting device obtained in Example 1.

FIG. 8 shows that increasing the total thickness of the underlying layer 3a and n-contact layer 3b resulted in larger values for Δa, approaching zero. That is, it was demonstrated that Δa can be controlled by the total thickness of the underlying layer 3a and the n-contact layer 3b. With a total thickness of 4 µm, Δa was a value of 0.065, outside the range of the invention, and the emission intensity was reduced to approximately 7 mW.

With a total thickness of 6 µm or greater, Δa was within the range of the invention and a light-emitting device with satisfactory emission characteristics was obtained.

INDUSTRIAL APPLICABILITY

The Group III nitride semiconductor light-emitting device of the invention has very excellent emission efficiency and is therefore of high industrial utility for lamps, laser diodes and the like.

The invention claimed is:

1. A Group III nitride semiconductor light-emitting device having an n-type layer, a light-emitting layer and a p-type layer composed of a Group III nitride semiconductor on a substrate, with the light-emitting layer sandwiched between the n-type layer and p-type layer, wherein the range for Δa as the ratio of the difference between the a-axis lattice constant of the layer between the light-emitting layer and substrate (or in the case of multiple layers with different compositions between the light-emitting layer and substrate, where each layer is grouped according to composition, the a-axis lattice constant of the group having the maximum thickness considering all of the layers belonging to the group) $a_1$ and the a-axis lattice constant of the light-emitting layer (or if the light-emitting layer has a multiple quantum well structure, the a-axis lattice constant determined from the zero-order peak representing the average composition of the well layers and barrier layers) $a_2$, represented by the following formula (I), is −0.05≦Δa≦0.05 (unit: %)

$$\Delta a = 100(a_1 - a_2)/a_1 \qquad (I).$$

2. A Group III nitride semiconductor light-emitting device according to claim 1, wherein the Group III nitride semiconductor is represented by the formula $Al_XGa_YIn_ZN_{1-A}M_A$ (0≦X≦1, 0≦Y≦1, 0≦Z≦1 and X+Y+Z=1, wherein M represents a Group V element different from nitrogen (N), and 0≦A<1).

3. A Group III nitride semiconductor light-emitting device according to claim 1, wherein the substrate is sapphire.

4. A Group III nitride semiconductor light-emitting device according to claim 1, wherein the layer between the light-emitting layer and the substrate (or in the case of multiple layers with different compositions between the light-emitting layer and substrate, where each layer is grouped according to composition, the group having the maximum thickness considering all of the layers belonging to the group) is an n-type GaN layer.

5. A Group III nitride semiconductor light-emitting device according to claim 1, wherein the light-emitting layer has a multiple quantum well structure.

6. A Group III nitride semiconductor light-emitting device according to claim 5, wherein the barrier layer of the multiple quantum well structure is composed of $Al_XGa_YIn_ZN$ ($0 \leq X \leq 1$, $0 \leq Y \leq 1$, $0 \leq Z \leq 1$, $X+Y+Z=1$), and the well layer is composed of $Ga_YIn_ZN$ ($0 \leq Y \leq 1$, $0 \leq Z \leq 1$, $Y+Z=1$).

7. A Group III nitride semiconductor light-emitting device according to claim 1, wherein the substrate is sapphire, the layer between the light-emitting layer and the substrate (or in the case of multiple layers with different compositions between the light-emitting layer and substrate, where each layer is grouped according to composition, the group having the maximum thickness considering all of the layers belonging to the group) is an n-type GaN layer, the light-emitting layer has a multiple quantum well structure wherein the barrier layer is composed of $Al_XGa_YIn_ZN$ ($0 \leq X \leq 1$, $0 \leq Y \leq 1$, $0 \leq Z \leq 1$, $X+Y+Z=1$) and the well layer is composed of $Ga_YIn_ZN$ ($0<Y<1$, $0<Z<1$, $Y+Z=1$), and the lattice constants $a_1$ and $a_2$ are larger than 3.181 Å.

8. A Group III nitride semiconductor light-emitting device according to claim 1, wherein the thickness of the layer between the light-emitting layer and the substrate (or in the case of multiple layers with different compositions between the light-emitting layer and substrate, where each layer is grouped according to composition, the group having the maximum thickness considering all of the layers belonging to the group) is 1-20 μm.

9. A lamp comprising a Group III nitride semiconductor light-emitting device according to claim 1.

* * * * *